United States Patent [19]

Kani et al.

[11] Patent Number: 5,985,513
[45] Date of Patent: Nov. 16, 1999

[54] PHOTOSENSITIVE COMPOSITION COMPRISING ARYL-SUBSTITUTED POLYSILANE AND PEROXIDE-SUBSTITUTED BENZOPHENONE

[75] Inventors: Rikako Kani, Yokohama; Yoshihiko Nakano, Tokyo; Shuji Hayase, Yokohama, all of Japan

[73] Assignee: Kabushiki Kaisha Toshiba, Kawasaki, Japan

[21] Appl. No.: 08/865,067

[22] Filed: May 29, 1997

[30]        Foreign Application Priority Data

May 29, 1996  [JP]  Japan ................................. 8-135048

[51] Int. Cl.$^6$ ....................................................... G03C 1/73
[52] U.S. Cl. ............................ 430/270.1; 522/46; 522/60
[58] Field of Search ........................... 430/270.1; 522/46, 522/60

[56]             References Cited

U.S. PATENT DOCUMENTS

| | | | |
|---|---|---|---|
| 4,587,205 | 5/1986 | Harrah et al. | 430/270.1 |
| 4,719,273 | 1/1988 | Seyforth et al. | 522/60 |
| 5,372,908 | 12/1994 | Hayase et al. | 430/270.1 |
| 5,776,634 | 7/1998 | Ohkuma et al. | 430/281.1 |

FOREIGN PATENT DOCUMENTS

| | | |
|---|---|---|
| 0 650 093 | 4/1995 | European Pat. Off. . |
| 0 725 315 | 8/1996 | European Pat. Off. . |
| 8-337708 | 12/1996 | Japan . |

OTHER PUBLICATIONS

S. Hayase, et al., "Syntheses of Polysilanes with Functional Groups. 2. Polysilanes with Carboxylic Acids", Macromolecules, vol. 22, 1989, pp. 2933–2938.
J.V. Beach, et al. "Enviromentally Friendly Polysilanes. An Alternative Route to Polysilane Photoresists.", ACS Spring Meeting 1995, PMSE, vol. 72, Apr. 1995, pp. 205–206.

*Primary Examiner*—Maria Nuzzolillo
*Assistant Examiner*—Laura Weiner
*Attorney, Agent, or Firm*—Oblon, Spivak, McClelland, Maier & Neustadt, P.C.

[57]                ABSTRACT

The present invention relates to a photosensitive composition comprising a polysilane having a repeating unit represented by the following general formula (1) and a benzophenone type compound having an organic peroxide, (1)

wherein Ar represents a substituted or unsubstituted aryl group.

7 Claims, 4 Drawing Sheets

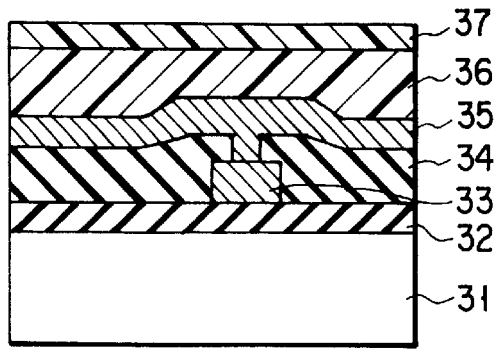
F I G. 4A
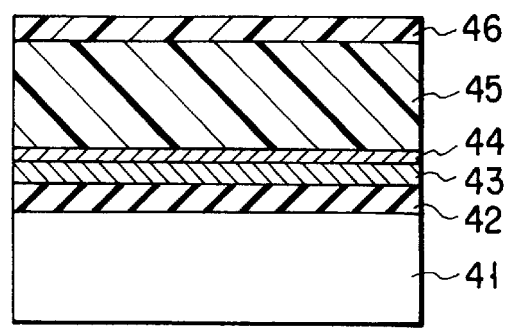
F I G. 5A
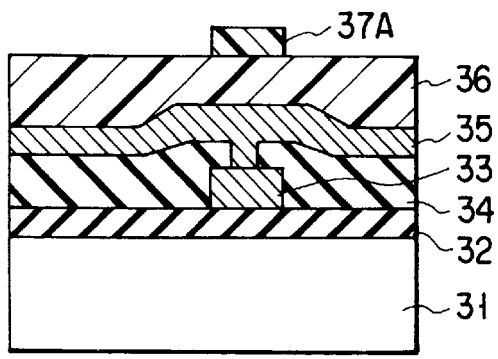
F I G. 4B
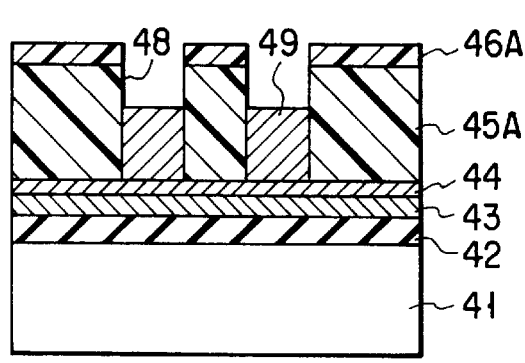
F I G. 5B
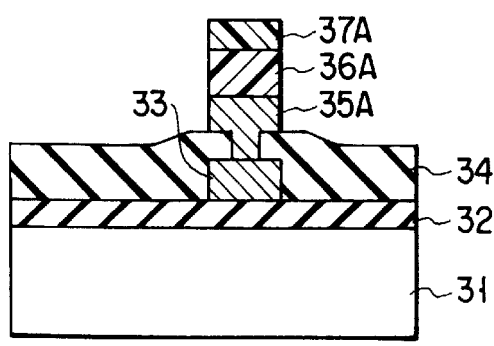
F I G. 4C
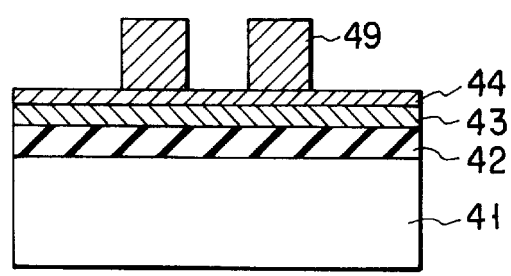
F I G. 5C
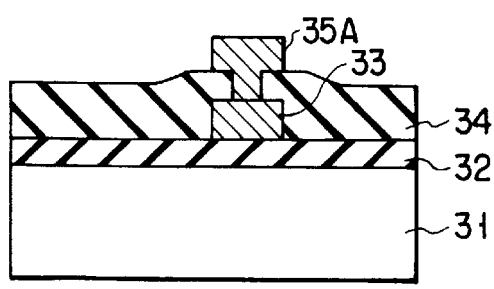
F I G. 4D
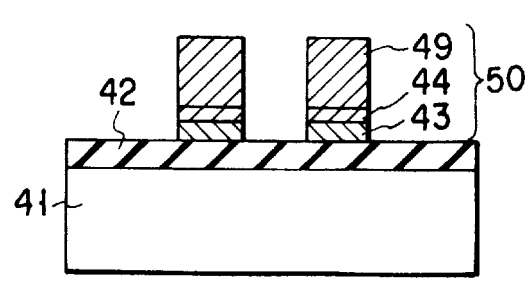
F I G. 5D

PHOTOSENSITIVE COMPOSITION COMPRISING ARYL-SUBSTITUTED POLYSILANE AND PEROXIDE-SUBSTITUTED BENZOPHENONE

BACKGROUND OF THE INVENTION

The present invention relates to a photosensitive composition capable of pattern formation for use in the production of electronic elements such as semiconductor devices and liquid crystal display devices.

For production of electronic device such as semiconductor elements, integrated circuits, fine processing techniques by photoetching is used. For photoetching, for example, a resist film is formed on a silicon monocrystal wafer etc. by spin coating and exposed to light via a mask having a desired pattern. Then, the resist film after exposure to light is subjected to development treatment and then rinsed to form a resist pattern. Thereafter, the resulting pattern is used as an etching mask to etch the wafer to form a line or open a window.

In the fine processing techniques, product accuracy depends mainly on the performance of the resist used, i.e. resolution on a substrate, accuracy of photosensitivity, and adhesive properties on the substrate or resistance to etching.

Recently, there is increasing hope of polysilane as such a resist. For examples, the techniques of forming a positive pattern by use of polysilane are disclosed in Jpn. Pat. Appln. KOKAI Publication No. 62-228542. A pattern formed using a resist containing a silicon-containing compound such as polysilane has the following characteristics: If such a resist pattern is subjected to oxygen reactive ion etching (oxygen RIE), a film made of e.g. $SiO_2$ is formed on the surface of the resist film. Accordingly, the resist pattern has high oxygen RIE properties.

In this prior art, however, a volatile photo-depolymerization polymer is formed by irradiating polysilane with actinic radiation, and then the formed photodepolymerization polymer is evaporated to form a pattern. Therefore, it is very difficult to form a fine pattern accurately in such dry development. Further, there is also the problem that the formation of a pattern by means of conventional polysilane is still inadequate in respect of sensitivity.

As an alternative method, a method of forming a pattern by use of polysilane in wet etching is proposed. Polysilane possesses the properties by which its molecular weight is reduced upon exposure to light by irradiation with ultraviolet light. Therefore, a polysilane film formed on a substrate is selectively exposed to light and then developed by selectively dissolving it in a polar solvent such as alcohol, ketone etc. to form a pattern.

However, when pattern formation is carried out by use of a photosensitive composition consisting of polysilane only, several joules/cm² are required as exposed light. In addition, there is the problem that the sectional shape and resolution of the resulting pattern become poor.

Although pattern formation by use of polysilane as a resist has been attempted as described above, it is often difficult to form a fine pattern accurately and sensitivity is also often poor in the case of a resist containing only polysilane. Further, if pattern formation is made feasible by alkali development, an improvement in pattern accuracy can be expected, but polysilane is generally insoluble in an aqueous alkaline solution, so pattern formation by alkali development is not possible.

In view of the above-described problems an object of the invention is to provide a photosensitive composition capable of accurately and highly sensitively forming a fine pattern excellent in sectional shape.

Another object of the present invention is to provide a pattern forming method capable of forming a fine pattern by alkali development.

A further object of the present invention is to provide a process for producing an electronic device, which comprises using the resulting pattern to carry out fine processing accurately.

BRIEF SUMMARY OF THE INVENTION

According to the present invention, there is provided a photosensitive composition comprising polysilane having a repeating unit represented by the following general formula (1) and a benzophenone type compound having an organic peroxide:

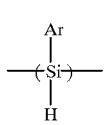

(1)

wherein Ar represents a substituted or unsubstituted aryl group.

According to the present invention, there is further provided a process for forming a pattern, comprising the steps of:

forming on a substrate a film containing a photosensitive composition comprising polysilane having a repeating unit represented by the following general formula (5) and a benzophenone type compound having an organic peroxide;

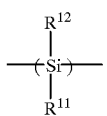

(5)

wherein $R^{11}$ represents a hydrogen atom, a substituted or unsubstituted alkyl group, or a substituted or unsubstituted aryl group, and $R^{12}$ represents a substituted or unsubstituted alkyl group, or a substituted or unsubstituted aryl group:

exposing to light a predetermined region on the photosensitive composition film; and developing the light-exposed portion of the photosensitive composition film by dissolving it in an aqueous alkali solution for removal.

According to the present invention, there is further provided a process for producing an electronic device, comprising the steps of:

forming on a substrate a film containing a photosensitive composition comprising polysilane having a repeating unit represented by the following general formula (5) and a benzophenone type compound having an organic peroxide;

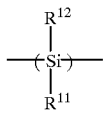

(5)

where $R^{11}$ represents a hydrogen atom, a substituted or unsubstituted alkyl group, or a substituted or unsubstituted aryl group, and $R^{12}$ represents a substituted or unsubstituted alkyl group, or a substituted or unsubstituted aryl group:

exposing to light a predetermined region on the photosensitive composition film;

developing the light-exposed portion of the photosensitive composition film by dissolving it in an aqueous alkaline solution for removal to form a patterned photosensitive composition film;

heat-treating the pattern of the photosensitive composition film to prepare a silicon oxide film pattern; and transferring the pattern to a substrate by use of the resulting silicon oxide film pattern as an etching mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4D are sectional views showing another example of the steps for carrying out the process for producing an electronic device according to the present invention; and FIGS. 5A to 5D are sectional views showing another example of the steps for carrying out the process for producing an electronic device according to the present invention.

DETAILED DESCRIPTION OF THE INVENTION

Figure 1A:
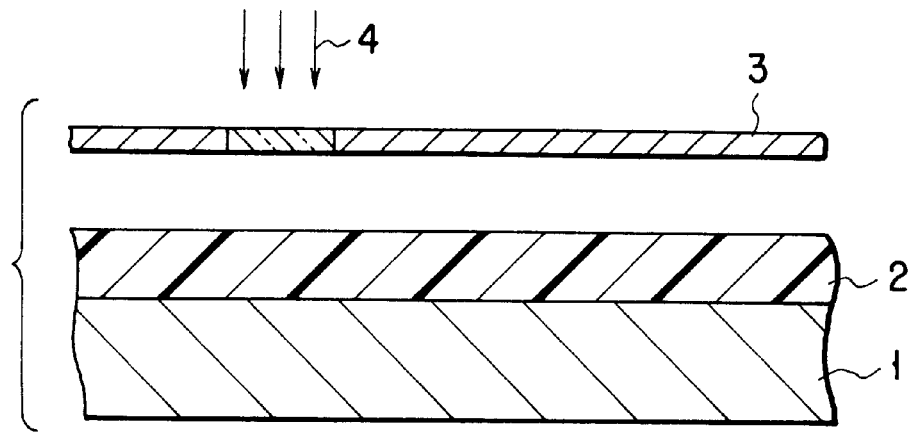
FIGS. 1A to 1C are sectional views showing an example of the steps for carrying out the process for producing an electronic device according to the present invention.

Hereinafter, the photosensitive composition of the present invention is described in more detail.

The polysilane contained in the photosensitive composition of the present invention is irradiated with energy beams such as electron beam, X-ray etc. whereby a hydrogen atom bonded to silicon atom as one side chain of the polysilane is converted into a hydroxy group to form a Si—OH bond. After decomposition with energy beam as described above, the Si—Si backbone chain in the polysilane can also form a Si—OH bond by incorporation of oxygen and water from the atmosphere and resist film.

If as shown in the above general formula (1), an aryl group is bonded to silicon atom as another side chain, the acidity of the silanolic hydroxyl group thus formed is extremely high and the polysilane shows large solubility in an aqueous alkali solution. In addition, the formed silanolic hydroxyl groups are hard to react with one another and are thus stabilized without mutual cross-linking etc., compared with the case where alkyl groups are bonded to silicon atom as the side chains. Therefore, a great difference in solubility to an aqueous alkali solution occurs between the unexposed portion containing polysilane not having any silanolic hydroxyl group and the light-exposed portion containing polysilane having the silanolic hydroxyl groups formed as described above. Accordingly, a positive pattern can be obtained by selectively dissolving and remove the light-exposed portion of the polysilane film by alkali development.

Further, when the photosensitive composition of the present invention is used, the unexposed portion is inherently insoluble in an aqueous alkali solution, and thus it is not necessarily required for the Si—Si backbone chain of the polysilane to be decomposed upon irradiation with an energy beam in order to cause a difference in molecular weight between the exposed and unexposed portions. Accordingly, the pattern as described above can be formed.

In addition, since the photosensitive composition of the present invention contains a benzophenone type peroxide liable to photodecomposition, the peroxide is decomposed upon exposure of the photosensitive composition film to light and it acts as a catalyst. That is, the Si—Si backbone chain of the polysilane having a repeating unit represented by the above general formula (1) is cut off and Si—H groups are activated to degrade the compound into a low-molecular compound, whereby stable silanolic hydroxyl groups (Si—OH) are selectively formed in the light-exposed portion. Therefore, it is extremely advantageous in raising photosensitivity towards actinic irradiation at the time of exposure to light.

Furthermore, the benzophenone type peroxide is inherently insoluble to the aqueous alkali solution, however the photodecomposed product thereof shows solubility in the aqueous alkali solution. Therefore, photodecomposition of the benzophenone type peroxide also contribute to increasing photosensitivity.

In the photosensitive composition of the present invention, the aryl group introduced into a side chain of the polysilane is exemplified as a phenyl group, naphthyl group and anthranyl group. In addition, such polysilane is not limited to a homopolymer and may be a copolymer with a repeating unit other than the repeating unit represented by the general formula (1). In the case of a copolymer, the content of the repeating unit represented by the general formula (1) is preferably not less than 30%, more preferably not less than 50%. The molecular weight of the polysilane is not particularly limited and preferably ranges from 500 to 100,000, more preferably 1,000 to 10,000. This is because a too low molecular weight of polysilane makes the formation of a sufficiently durable film difficult, while a too high molecular weight of polysilane results in a lower solubility in solvent and the formation etc. of a film tends to be cumbersome. Examples of polysilanes used in the present invention are as follows:

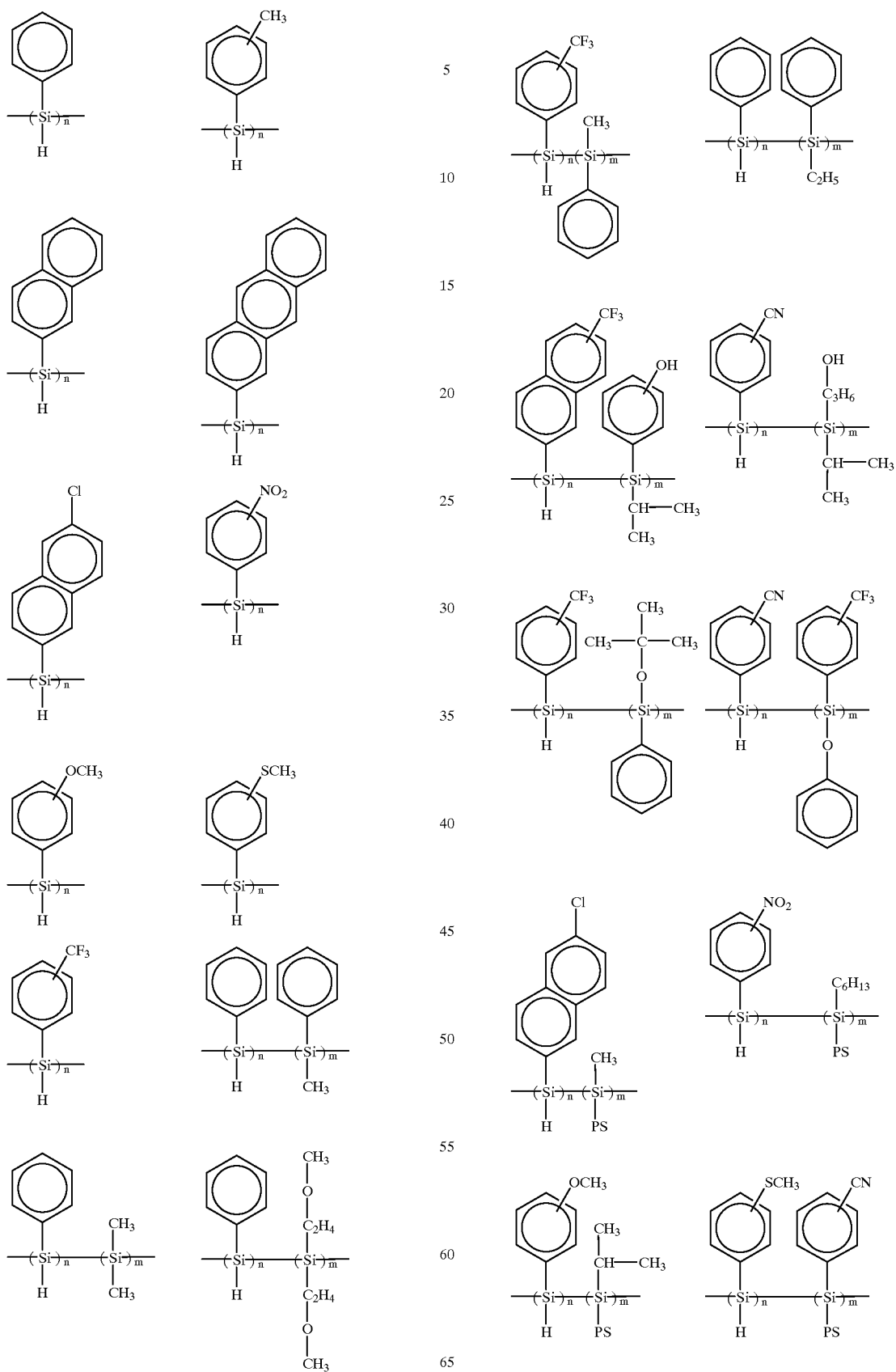

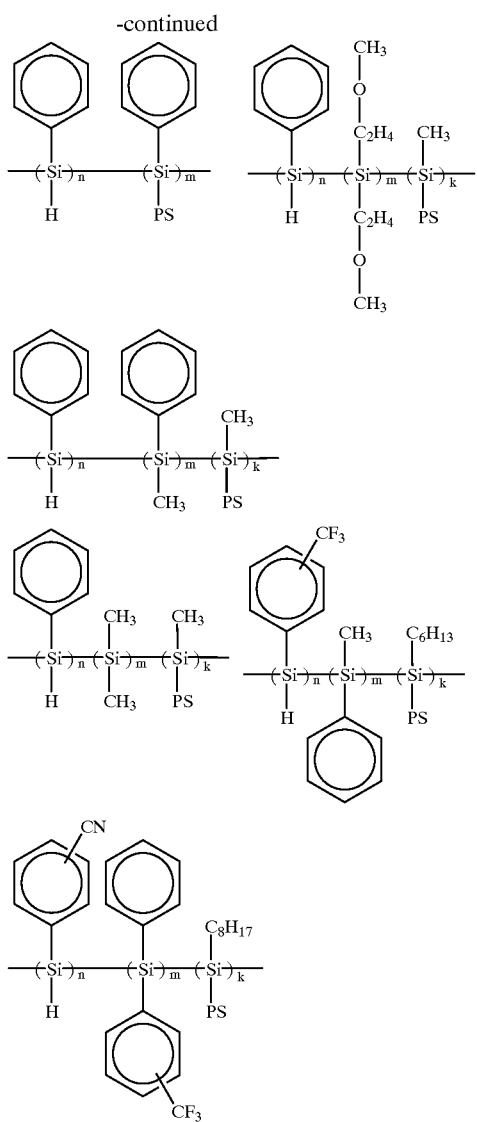

where m, n and k each represent degree of polymerization, and PS is a polysilane skeleton.

Such polysilane can be synthesized in the presence of a sodium-based catalyst by a reductive coupling or an electrolytic polymerization of $RSiHCl_2$. As described above, a copolymer may be synthesized: for example, in the case of synthesis in reductive coupling reaction, it may be copolymerized with $R'R''SiCl_2$ (wherein R' and Rr" each represent a substituted or unsubstituted hydrocarbon group). For controlling the polymerization degree of the polysilane, RSiHACl (wherein A represents a terminal group), may be copolymerized as necessary. However, if polysilane is synthesized through a reductive coupling reaction, the sodium-based catalyst may remain as an ionic impurity in the resultant polysilane.

The polysilane as described above can also be synthesized by de-hydrogenation of $RSiH_3$ in the presence of a titanium or zirconium catalyst. For this synthesis, the polysilane, which was synthesized via de-hydrogenation reaction using particularly a zirconium catalyst, neither contains any ionic impurities nor forms a silanolic hydroxyl group bonded to a silicon atom at the polymer terminal, and thus such a photosensitive composition is extremely advantageous to form a fine pattern by alkali development.

In the photosensitive composition of the present invention, the benzophenone type compounds having an organic peroxide are preferably compounds represented by the following formulas (2) to (4). Because such benzophenone type compounds readily undergo photo-decomposition upon irradiation with actinic radiation, a hydrogen atom in the polysilane side chain can be activated to easily form a silanolic bonding.

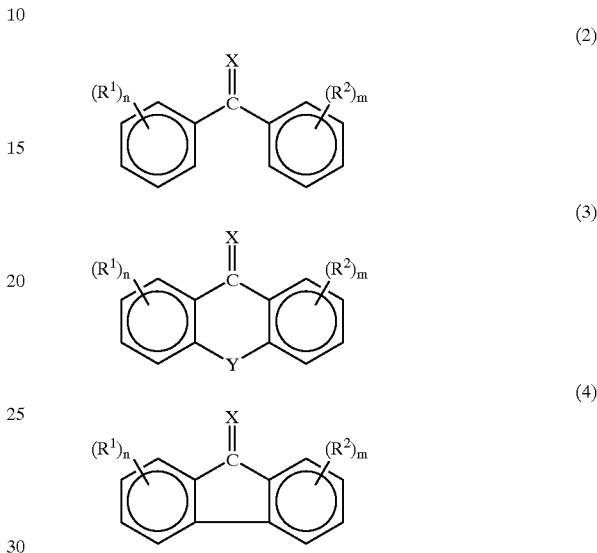

In the formulas, $R^1$ and $R^2$ each represent a group having an organic peroxide and may be the same or different, and examples include:

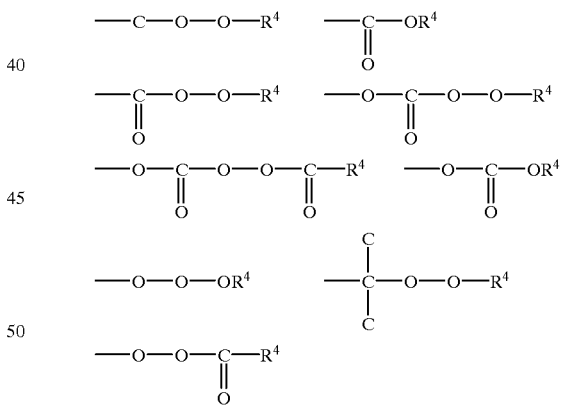

In the above groups, $R^4$ is an alkyl group.

In addition, X is an oxygen atom or sulfur atom, Y is an oxygen atom, sulfur atom, $—CH_2—$, or $—N(R^3)—$ (wherein $R^3$ is an alkyl group), and m and n are an integer of 0 to 5 provided that m and n are not simultaneously 0. More specifically, the benzophenone type compounds having an organic peroxide, are preferably the following compounds, particularly 3,3',4,4'-tetra(t-butylperoxycarbonyl) benzophenone (BTTB).

(BB-1)
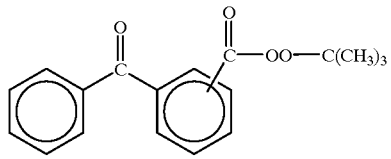

(BB-2)
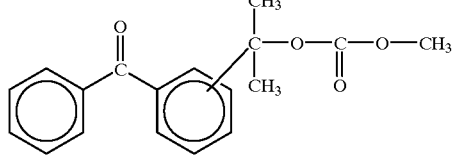

(BB-3)
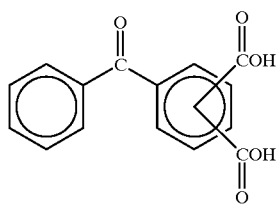

(BB-4)
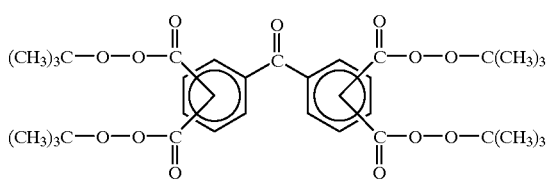

(BB-5)
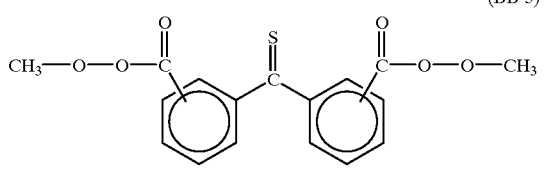

(BB-6)
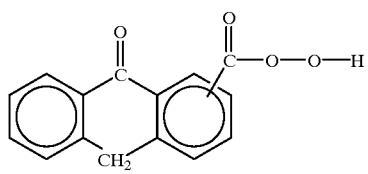

(BB-7)
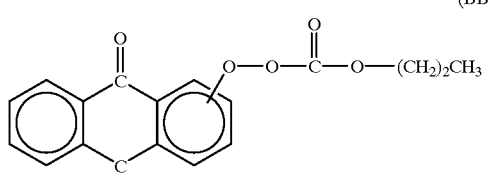

(BB-8)
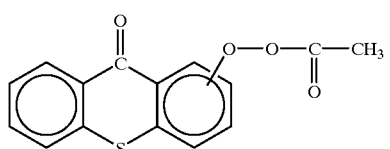

-continued (BB-9)
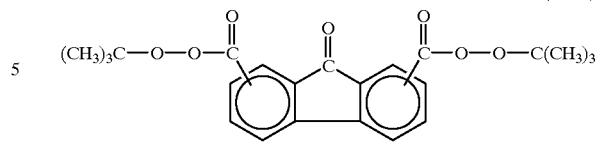

(BB-10)
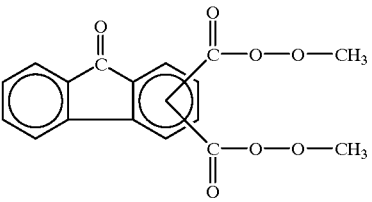

(BB-11)
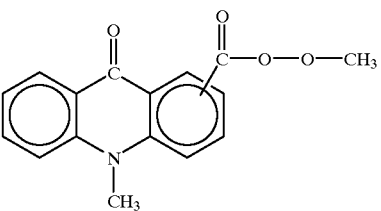

In the photosensitive composition of the present invention, the content of the benzophenone type compound having an organic peroxide is preferably 0.1 to 30 parts by weight, more preferably 1 to 15 parts by weight, based on 100 parts by weight of polysilane. If its content is less than 0.1 part by weight, it would be difficult to obtain a sufficient reaction with polysilane at the time of exposure to light, while if its content exceeds 30 parts by weight, there is a fear of lowered compatibility with polysilane to cause precipitates making the formation of a uniform film impossible. In forming a pattern, it would be caused a reduction in the solubility of the light-exposed portion in the alkali developing solution.

In the photosensitive composition of the present invention, a cross-linking agent for polysilane may be further comprised, and such a resist is used to form a pattern and the polysilane in the pattern is then cross-linked whereby the strength, thermal resistance etc. of the pattern can be improved. As the cross-linking agent, use can be made of a compound capable of thermal reaction with a hydrogen atom bonded to silicon atom as a side chain of polysilane, and specifically an unsaturated compound having 2 or more unsaturated groups in a molecule such as tetravinylsilane, phenylene dialdehyde etc. can be used. The unsaturated compound exhibits its effect when comprised in an amount of at least 1% by weight relative to polysilane. However, if the content of the unsaturated compound is too exceed, the component not contributing to the cross-linking of polysilane is increased so that the thermal resistance of the pattern may be lowered contrary to the purpose. Therefore, the upper limit of the content of the unsaturated compound is preferably 30% by weight.

In case the unsaturated compound described above is comprised in the photosensitive composition of the present invention, a radical generating-agent and ionic catalyst capable of promoting the reaction of silane with the unsaturated compound can be usually used in combination as cross-linking agents. The radical generating-agent includes azobis(isobutyronitrile) (AIBN), benzoylperoxide, dicumylperoxide, triphenyl-t-butylperoxide etc. The ionic catalyst includes a chloroplatinic acid and a complex having an unsaturated group coordinated in a chloroplatinic acid etc.

The content of the radical generating-agent is preferably 1 to 30% by weight, and the content of the ionic catalyst is set preferably at 0.1 to 5% by weight. This is because the reaction of polysilane with the unsaturated compound hardly proceeds where the contents of the radical generating-agent and ionic catalyst are too low, whereas the thermal resistance of the pattern may be lowered where their contents are too high.

According to the present invention, it is further possible to prepare a resist by incorporating an alkali-soluble organic compound into it. In this case, the photosensitive composition insoluble in an aqueous alkali solution serves as a dissolution inhibitor for the alkali-soluble organic compound and upon irradiation with energy ray, the polysilane produces silanolic hydroxyl groups and becomes dissolved in the aqueous alkali solution. Therefore, the light-exposed portion is selectively dissolved and removed by alkali development and a positive pattern can be formed.

As such alkali-soluble organic compounds, oligomers and polymers each having phenolic hydroxy groups and/or carboxylic acid residues can be used. For example, mention may be made of novolac resin obtained by condensation, with formaldehyde, of phenols such as phenol, o-chlorophenol, m-chlorophenol, p-chlorophenol, m-cresol, p-cresol, bisphenol A, and 4-chloro-3-cresol; a copolymer of methylmethacrylate and poly(p-vinylphenol), poly(p-isopropenylphenol), poly(m-isopropenylphenol) or p-hydroxy styrene; a copolymer of p-hydroxystyrene and methylacrylate; a copolymer of p-isopropenylphenol and methylacrylate; a copolymer of p-hydroxystyrene and methacrylic acid; and polyamic acid etc. Examples of alkali-soluble organic compounds which can be used in the present invention are as follows:

alkali-soluble organic compound is too high. To obtain adequate performance of the alkali-soluble organic compound, the content of the alkali-soluble organic compound is preferably not less than 0.01% by weight.

In addition to the above-described components, a radical generating-agent, acid generating-agent etc. may be added as sensitizers to the photosensitive composition of the present invention as necessary. Further, pigments etc. may be added to raise sensitivity by use of their light excitation or a light-exposed region may be limited.

The radical generating-agent is a compound generating a radical upon irradiation with actinic radiation. Examples include azo compounds such as azobis(isobutyronitrile) etc.; peroxides such as benzoylperoxide, di-tert-butylperoxide etc.; alkylarylketones such as benzoin, benzoinalkylether, benzoinalkylarylthioether, benzoylarylether, benzoylalkylarylthioether, benzylalkylethanol, phenylglyoxalalkylacetal, benzoyloxime etc.; and organic halides.

The acid generator-agent is a compound generating acid upon irradiation with actinic radiation. Examples include an onium salt, a halogen-containing compound, an orthoquinone diazide compound, a sulfone compound, a sulfonic acid compound, and a nitrobenzyl compound. Among these, an onium salt and orthoquinone diazide compound are preferred.

The pigments which can be used are coumarin type, cyanine type, melocyanine type, acridine type etc.

The content of the sensitizers described above is preferably in the range of 0.1 to 30 parts by weight, more preferably 1 to 10 parts by weight, based on 100 parts by weight of polysilane represented by the above general formula (1).

The polysilane and the benzophenone type compound containing an organic peroxide compound as described above and if necessary a cross-linking agent for polysilane and an alkali-soluble organic compound are dissolved in a

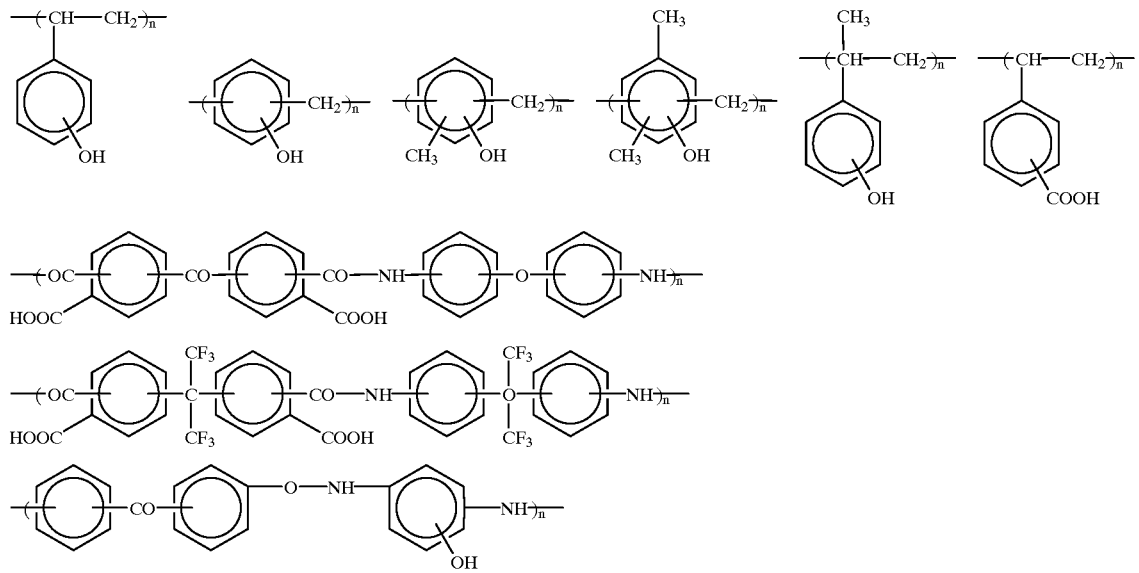

where n is degree of polymerization.

If the alkali-soluble organic compound is comprised in the photosensitive composition of the present invention, the content of the alkali-soluble organic compound is preferably set preferably at not higher than 95% by weight. This is because sensitivity tends to decrease if the content of the suitable organic solvent to prepare the photosensitive composition of the present invention. The organic solvent is specifically toluene, xylene, dimethylformamide, dimethylacetamide, methyl Cellosolve, o-dichlorobenzene, chloroform, ethanol, i-propyl alcohol, cyclopentanone, cyclohexanone, ethyl Cellosolve acetate, acetone, methylethylketone, ethylacetate, and butylacetate. These organic solvents can be used singly or in combination.

Next, the process for forming a pattern according to the present invention is described in detail.

In the pattern forming method of the present invention, is used a photosensitive composition comprising polysilane having a repeating unit represented by the following general formula (5) and a benzophenone type compound having an organic peroxide.

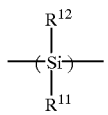
(5)

In the above general formula (5), $R^{11}$ is a hydrogen atom, a substituted or unsubstituted alkyl group, or a substituted or unsubstituted aryl group, and $R^{12}$ is a substituted or unsubstituted alkyl group, or a substituted or unsubstituted aryl group.

As described above, the benzophenone type compound is photodecomposed upon irradiation with light to act as a catalyst which facilitates cleavage of the Si—Si backbone chain in the polysilane. That is, when a predetermined region on a coated film containing the photosensitive composition including the polysilane of formula (5) and a specific benzophenone type compound is irradiated with light, the polysilane in the light-exposed portion is decomposed into low-molecular compounds to selectively form stable silanolic bonds.

Then, the photosensitive composition film after exposure to light is developed of an aqueous alkali solution whereby the light-exposed portion of the photosensitive composition film is selectively dissolved and removed to form a positive pattern. If the photosensitive composition film after exposure to light is thermally treated, polysiloxane with a high density of cross-linkage is formed at the light-exposed portion. This polysiloxane is less dissolved in an organic solvent than polysilane. Therefore, if the photosensitive composition film after thermal treatment in this manner is developed in an organic solvent, the unexposed portion of the photosensitive composition film is selectively dissolved and removed to form a negative pattern.

In this manner, positive and negative patterns can be easily formed according to the present invention. In particular, if a positive pattern is formed using polysilane containing Si—H bonds, the activation of Si—H bonds occurs together with the cleavage of the Si-Si backbone chain. Accordingly, the formation of silanolic bonds in the light-exposed portion of the photosensitive composition film is promoted. Therefore, its solubility in an alkali developing solution is increased and the sectional shape of the finally formed pattern is excellent and its dissolution is also improved.

In the general formula (5), the alkyl groups introduced as $R^{11}$ and $R^{12}$ are not particularly limited, and an arbitrary alkyl group can be used. The aryl groups introduced as $R^{11}$ and $R^{12}$ are exemplified as a phenyl group, naphthyl group and anthranyl group. In the general formula (5), if $R^{11}$ is a hydrogen atom and $R^{12}$ is an aryl group, the resulting compound corresponds to the polysilane represented by the above general formula (1).

Polysilane having the repeating unit represented by the above general formula (5) is not limited to homopolymers and includes copolymers with a repeating unit other than the repeating unit represented by the general formula (5). In the case of a copolymer, the content of the repeating unit represented by the general formula (5) is preferably not less than 30%, more preferably not less than 50%. The molecular weight of the polysilane is not particularly limited and preferably ranges from 500 to 100,000, more preferably 1,000 to 10,000. This is because a too low molecular weight of polysilane makes the formation of a sufficiently durable film difficult, while a too high molecular weight of polysilane results in a lower solubility in solvent and the formation etc. of a film tends to be cumbersome.

In the process for forming a pattern according to the present invention, it is possible to employ the following polysilanes in addition to the polysilanes having a repeating unit represented by the general formula (1).

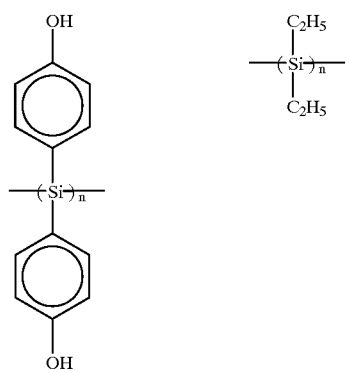

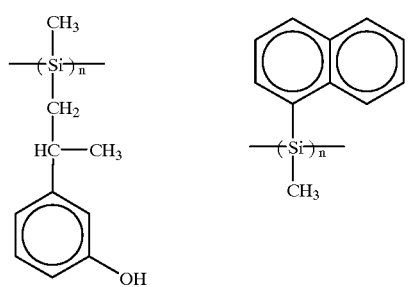

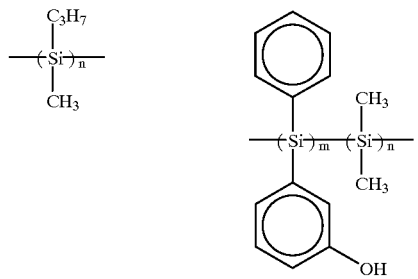

-continued

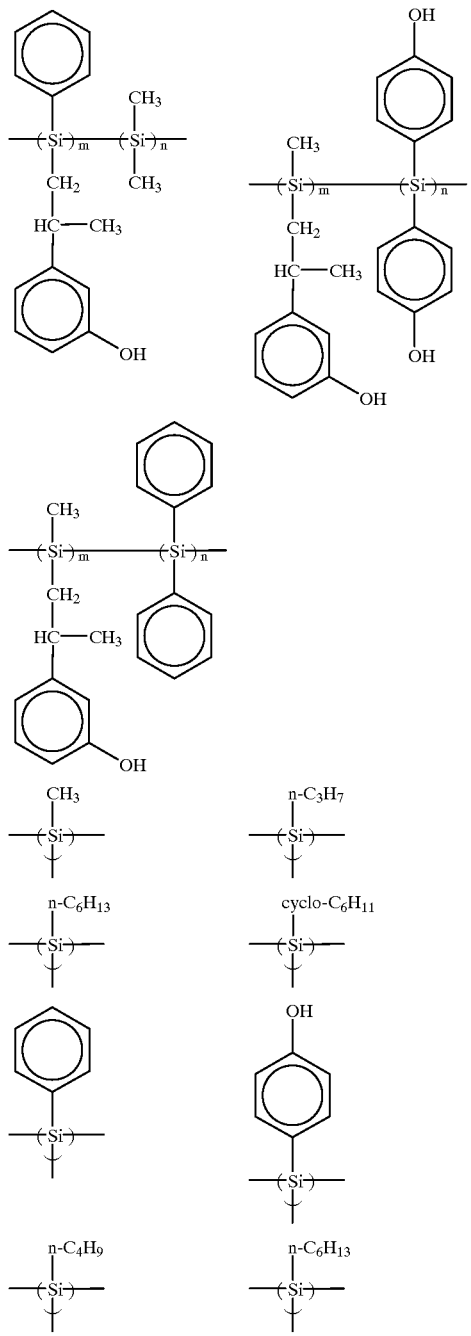

where m and n each represent degree of polymerization.

Such polysilane can be synthesized in the presence of a sodium-based catalyst by a reductive coupling or an electrolytic polymerization of $RSiHCl_2$. As described above, a copolymer may be synthesized: for example, in the case of synthesis in reductive coupling reaction, it may be copolymerized with $R'R''SiCl_2$ (wherein R' and R" each represent a substituted or unsubstituted hydrocarbon group). For controlling the polymerization degree of the polysilane, RSiHACl (wherein A represents a terminal group), may be copolymerized as necessary. However, if polysilane is synthesized by reductive coupling reaction, the sodium-based catalyst may remain as an ionic impurity in the resultant polysilane.

Among the polysilanes having a repeating unit represented by the general formula (5), polysilanes having Si—H bonds can be synthesized in the same manner as for the polysilane having a repeating unit represented by the above general formula (1).

The benzophenone type compound having an organic peroxide, contained in the photosensitive composition used in the process for forming a pattern according to the present invention is preferably a compound represented by the above general formulas (2) or (4). For the same reason as above, the content of the benzophenone type compound is preferably 0.1 to 30 parts by weight, more preferably 1 to 15 parts by weight, based on 100 parts by weight of polysilane.

The photosensitive composition used in the process for forming a pattern according to the present invention can be referred to as a composition containing polysilane having a repeating unit represented by the above general formula (5) comprised on it in place of polysilane having a repeating unit represented by the above general formula (1). Therefore, the above-described radical generating-agent, acid generating-agent, alkali-soluble organic compound etc. can also be comprised in the amounts as described above. The organic solvents used in preparation of the photosensitive composition may be those described above.

The process for forming a pattern according to the present invention by use of the photosensitive composition as described above is as follows. A resist solution prepared as described above is applied onto a given substrate and the resulting coated film is pre-baked to evaporate the organic solvent to a certain degree whereby a resist film is formed. Then, the surface of the resist film is irradiated via a desired mask pattern with energy beams such as ultraviolet ray, KrF excimer laser ray, electron bean, X ray etc. The energy beam is preferably ultraviolet ray at a wavelength of 400 nm or less, and the irradiation is set preferably at 0.1 mJ/cm$^2$ to 5 J/cm$^2$ or thereabout. In this step, either contact exposure to light or projection exposure to light can be adopted.

By exposure to light in this manner, the benzophenone type peroxide in the photosensitive composition described above is decomposed to act as a catalyst to promote cleavage of the backbone chain of polysilane and activation of a —H bond. Moreover, since the photodecomposed product of the benzophenone type peroxide shows solubility in an aqueous alkali solution, photodecomposition of the benzophenone type peroxide contributes to improving the photosensitivity. In this manner, the polysilane in the exposed portion forms silanolic hydroxyl groups (Si—OH) as described above to exhibit solubility in an aqueous alkali solution, so that the light-exposed portion of the resist film can then be selectively dissolved and removed to form a positive pattern. Examples of aqueous alkali solutions used in this step are aqueous organic alkali solutions such as tetramethyl ammonium hydroxide, choline etc. and aqueous inorganic alkali solutions such as potassium hydroxide, sodium hydroxide etc. The development method which can be used includes immersion, spraying etc. A positive pattern can also be formed using an aqueous hydrofluoric acid solution in place of an aqueous alkali solution.

The resulting pattern is desirably washed with water to sufficiently remove the developing agent component.

Hereinafter, an example of the process for producing an electronic device according to the present invention is described by reference to the drawings.

Figure 1B:
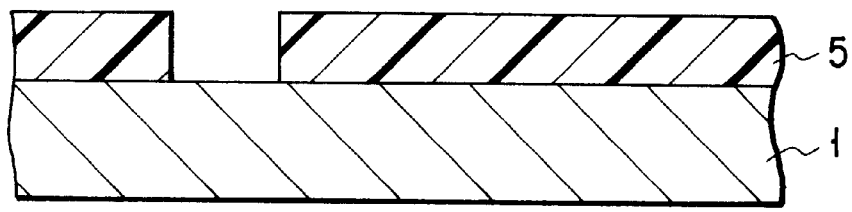
Figure 1C:
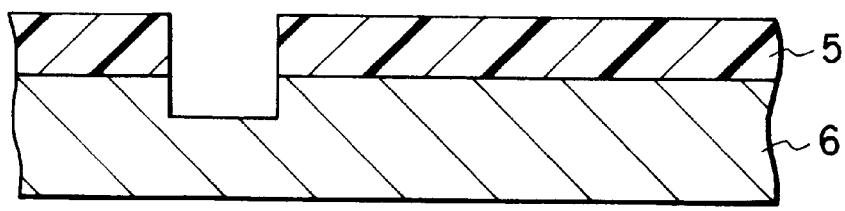

FIGS. 1A to 1C are sectional views showing an example of the steps for carrying out the process for producing an electronic device according to the present invention. As shown in FIG. 1A, film 2 containing the photosensitive composition as described above is formed on silicon substrate 1 and then irradiated with exposure light 4 via mask 3 having a predetermined pattern.

Then, it was thermally treated as necessary and then the light-exposed portion of the photosensitive composition film was selectively dissolved and removed by development with an aqueous alkali solution to obtain patterned photosensitive composition film 5 shown in FIG. 1B. After development, it is subjected to thermal treatment at about 100 to 500° C. for about 1 to 10 minutes to form a silicon oxide film pattern.

The silicon oxide film pattern thus obtained is used as an etching mask to etch the substrate, thus transferring the pattern accurately to substrate 1 as shown in FIG. 1C. The etching method used may be wet or dry etching, and dry etching is preferably used for forming a 3 μm or less fine pattern.

The wet etching agent for carrying out wet etching can be selected depending on the subject to be etched. For example, when a silicon oxide film is subjected to etching, an aqueous hydrofluoric acid solution, aqueous ammonium fluoride solution etc. are preferable, and when aluminum is subjected to etching, an aqueous phosphoric acid solution, aqueous acetic acid solution, aqueous nitric acid solution etc. are preferable. If a chromium type film is subjected to etching, an aqueous cerium nitrate ammonium solution etc. are used.

The dry etching gas for carrying out dry etching includes e.g. $CF_4$, $C_2F_6$, $CCl_4$, $BCl_3$, $Cl_2$, $HCl$ and $H_2$. If necessary, these gases can be used in combination. As etching conditions, the concentration of the wet etching agent in a reaction chamber, reaction temperature, reaction time etc. are determined depending on the combination of the resist and the type of substance on which a fine pattern is formed. However, the method etc. are not particularly limited.

After the etching as described above was finished, the pattern formed using the photosensitive composition and the flattened layer remaining on the substrate is removed using a release agent such as J-100 (Nagase Kasei Co., Ltd., Japan), oxygen gas plasma etc. The silicon oxide film pattern used as an etching mask is excellent in strength, thermal resistance etc. and thus can be used as insulating film as such.

The present invention can also be applied to a 2-layered resist system to produce an electronic device. FIGS. 2A to 2E show sectional views showing an example of the steps for producing an electronic device in this case.

Figure 2A:
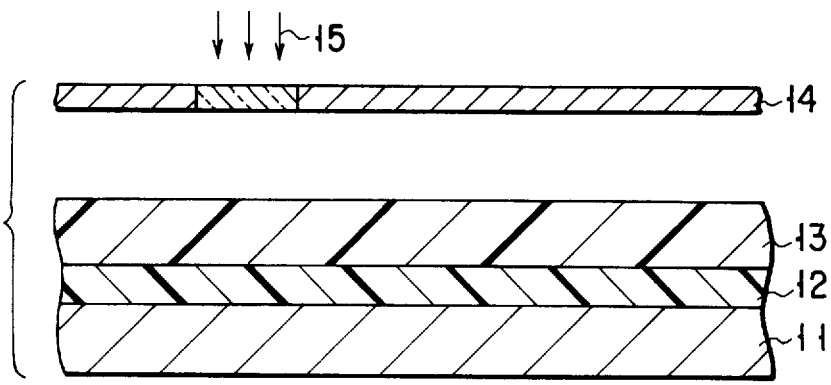
FIGS. 2A to 2E are sectional views showing another example of the steps for carrying out the process for producing an electronic device according to the present invention.

As shown in FIG. 2A, the flattened layer 12 and the film (resist film) 13 containing the photosensitive composition were formed in this order on substrate 11 to be subjected to fine processing. Examples of substrate 11 are a silicon wafer, a silicon wafer with a protruded surface having a wide variety of insulating films, electrodes, wiring etc. as well as a blank mask etc. A flattening agent is applied onto the substrate and then dried usually at 50 to 250° C., preferably 80 to 220° C. and for 0.5 to 120 minutes, preferably 1 to 90 minutes, whereby the flattened layer 12 having desired thickness can be formed. The flattening agent may be any one if it is of such purity that the production of semiconductor integrated circuits etc. can be carried out without hindrance. Examples of such flattening agents include a positive resist made of a substituted naphthoquinone diazide and novolac resin, as well as polystyrene, polymethylmethacrylate, polyvinylphenol, novolac resin, polyester, polyvinyl alcohol, polyethylene, polypropylene, polyimide, polybutadiene, polyvinylacetate, and polyvinylbutyrate etc. These resins are used solely or in combination.

Then, a solution containing the photosensitive composition is applied onto the resulting flattened layer 12 and pre-baked at 50 to 200° C., preferably 80 to 120° C. and for 0.5 to 120 minutes, preferably 1 to 60 minutes to form resist film 13 having desired thickness. The method of applying the resist liquid in this step includes spin coating using a spinner, immersion, spraying, printing etc. The thickness of the resist film can be arbitrarily controlled by the application method, the concentration of the polysilane in the resist liquid, the viscosity etc.

Figure 2B:
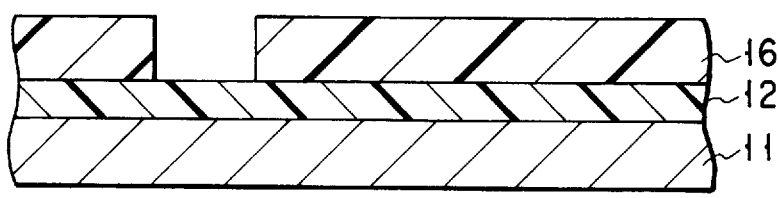

This resist film 13 is irradiated with exposure light 15 via mask 14 having a predetermined pattern, followed by thermal treatment as necessary. Then, the light-exposed portion of the resist film 13 is selectively dissolved and removed by development with an aqueous alkali solution to obtain the resist film 16 having the patterning as shown in FIG. 2B. After the developing treatment, the patterned resist film may be subjected to thermal treatment at about 50 to 200° C. for 0.5 to 120 minutes as necessary, preferably step baking. If a cross-linking agent is comprised in the photo-sensitive composition of the present invention, silicon atoms in the polysilane in the pattern are bonded to one another via the cross-linking agent by such thermal treatment and the cross-linking of the polysilane proceeds. Therefore, the strength and thermal resistance of the pattern are improved. Even in cases where no cross-linking agent for polysilane is comprised, silicon atoms in the polysilane can be bonded to one another via oxygen atoms after incorporation of the oxygen from the atmosphere etc., and therefore improvements in the strength, thermal resistance etc. of the pattern, based on the cross-linking of the polysilane, can be expected.

In this step, the pattern formed prior to the above thermal treatment may be exposed to light so that photo-oxidation of the polysilane, radical formation from a radical generating-agent, etc. may be previously induced to facilitate the progress of the cross-linkage of the polysilane during thermal treatment. Even if the cross-linking agent of the polysilane is not particularly comprised, the strong three-dimensional cross-linkage of silicon atoms in the polysilane can be formed by incorporating oxygen from the atmosphere etc. Further, light exposure is carried out in this way so that upon cleavage of the backbone chain of the polysilane, the silicon atoms can be bonded again to one another via oxygen atoms whereby a glass matrix extremely excellent in strength, thermal resistance etc. can be formed. As a result, the pattern of the resulting glass matrix itself can be used as a surface protective film, insulating film etc.

Figure 2C:
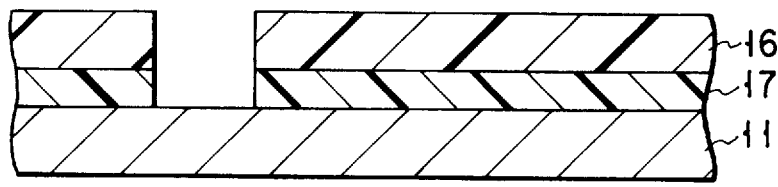

Then, the formed photosensitive composition film pattern 16 is used as a mask to etch the flattened layer 12 with oxygen gas plasma or suitable solvent. For this etching, an oxygen reactive ion etching method (oxygen RIE) using oxygen gas plasma is preferably used and carried out usually at $1\times10^{-4}$ to $1\times10^{-1}$ Torr and 0.01 to 10 w/cm² for 1 to 120 minutes. The pattern thus formed using the photosensitive composition of the present invention is subjected to oxygen RIE to form a silicon dioxide ($SiO_2$) film or a similar film on the surface layer, thus attaining 10- to 100-fold anti-oxygen RIE compared with that of the exposed flattened layer. Therefore, the exposed portion of the flattened layer in the pattern is selectively removed by the oxygen RIE method to obtain the carbon film 17 patterned as shown in FIG. 2C.

Figure 2D:
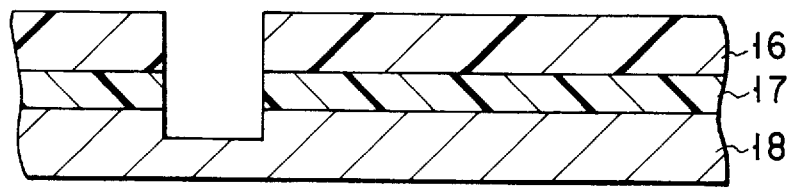

The photosensitive composition film pattern 16 and the carbon film pattern 17 thus obtained are used as an etching mask to etch substrate 11 in the procedure as described above, thereby transferring the pattern to it accurately whereby finely processed substrate 18 as shown in FIG. 2D is obtained.

Figure 2E:
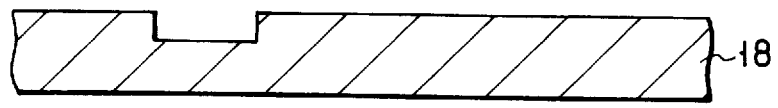

After etching, the carbon film pattern 17 and the photosensitive compound film pattern 16 remaining on the substrate are removed by e.g. a release solution such as hydrofluoric acid, organic solvent etc. or by oxygen gas plasma etc. to obtain the finely processed substrate shown in FIG. 2E.

Besides the above-described steps, an additional step may be added depending on the purpose. Examples of such additional steps include a pre-treatment step carried out before application of each solution for the purpose of improving adhesion between the resist layer containing the photosensitive composition of the present invention and the flattened layer or between the flattened layer and the substrate; a rinse step carried out for the purpose of removing a developing solution after development of the resist film; and a step of re-irradiation with ultraviolet ray carried out before dry etching. Although the application of the photosensitive composition of the present invention to a multi-layered resist system is illustrated above, the photosensitive composition of the present invention can also be applied to a conventional single-layered resist.

Hereinafter, the present invention is described in further detail by reference to Examples and Comparative Examples.

(EXAMPLE I)

(Synthesis of Polyphenyl Silane)

60 ml dried diethylether and 5.34g of zirconocene dichloride were mixed and stirred at −20° C. in an argon atmosphere. 1.5 M methyl lithium was added little by little to this mixture and stirred for 70 minutes. The mixture was further stirred at 0° C. for 30 minutes, and the diethylether was removed whereby a white solid was obtained. The white solid thus formed was sublimated to give zirconocene dimethyl.

Then, the resulting zirconocene dimethyl was added to phenylsilane and the phenylsilane was polymerized at room temperature for 5 hours to obtain a crude polymer. In this reaction, the phenylsilane/zirconocene dimethyl mixing ratio was 50:1 by molar ratio. Then, the resulting crude polymer was dissolved in toluene and added to methanol under stirring to precipitate the polymer again. The polymer was further precipitated twice in methanol and dried under reduced pressure at 80 to 90° C. to obtain polyphenylsilane (AA-1) with a weight average molecular weight of about 6,000 represented by the following formula:

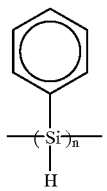

(AA-1)

(EXAMPLE I-1)

100 parts by weight of polyphenylsilane with the same structure as that of (AA-1) above except for its average molecular weight of 4,000 and 10 parts by weight of 3,3',4,4'-tetra(t-butylperoxycarbonyl)benzophenone (BTTB) were dissolved in toluene to obtain a toluene solution (photosensitive composition). This toluene solution (photosensitive composition) was spin coated onto a silicon substrate and pre-baked at 100° C. for 3 minutes to form a resist film of 0.6 µm in thickness. Then, the resist film was irradiated via a mask pattern with 100 mJ/cm$^2$ ultraviolet ray at a wavelength of 254 nm from a low-pressure mercury lamp. The resist film after irradiation was immersed in a 2.38 wt % aqueous tetramethyl ammonium hydroxide solution and developed at 25° C. for 60 seconds to form a resist pattern, and the resulting pattern was rinsed with purified water. As a result, a positive pattern excellent in its pattern shape could be formed with high accuracy.

(EXAMPLE I-2 to I-8)

The photosensitive compositions shown in Table 1 below were prepared and 7 positive patterns were formed in the same manner as in Example (I-1) except that the conditions for light exposure and development as shown in Table 1 were used. As a result, positive patterns were formed with high accuracy in any examples.

TABLE 1

| Examples | 1 | 2 | 3 | 4 | 5 | 6 | 7 | 8 |
|---|---|---|---|---|---|---|---|---|
| Polysilane | | | | | | | | |
| AA-1 | 100 | 100 | 100 | | | | | |
| AA-2 | | | | 100 | 100 | | | |
| AA-3 | | | | | | 100 | 100 | |
| AA-4 | | | | | | | | 100 |
| Peroxide | | | | | | | | |
| BB-1 | 10 | | 10 | 10 | | | | 10 |
| BB-4 | | 10 | | | | 10 | | |
| BB-9 | | | | | 10 | | 10 | |
| Film thickness (µm) | 0.6 | 0.6 | 0.6 | 0.6 | 0.6 | 0.6 | 0.6 | 0.6 |
| Pre-baking temp/time | 100° C. 3 min. | 100° C. 3 min. | 100° C. 3 min. | 100° C. 3 min. | 100° C. 3 min. | 100° C. 3 min. | 100° C. 3 min. | 100° C. 3 min. |
| Exposure light (nm) | 254 | 254 | KrF | 254 | 254 | 254 | 254 | 254 |
| Exposed amount | 200 | 100 | 200 | 200 | 200 | 100 | 200 | 100 |
| Developing solution | a | a | a | a | b | b | a | a |
| Developing time (sec.) | 60 | 60 | 60 | 60 | 60 | 60 | 60 | 60 |

*1: The unit of the exposure light is mJ/cm$^2$.
*2: The developing solution "a" is 2.38% aq. tetramethyl ammonium hydroxide, "b" is choline.

The polysilanes used herein are shown below together with their abbreviations.

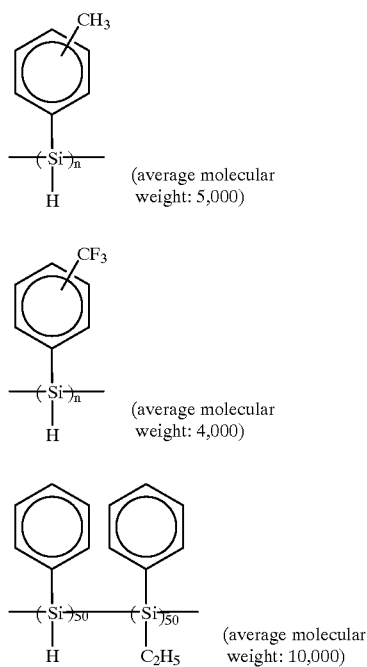

where n is degree of polymerization.

(COMPARATIVE EXAMPLE I-1)

A toluene solution containing 100 parts by weight of the same polysilane as in Example (I-1) was prepared. This toluene solution was spin coated onto a silicon substrate and pre-baked at 100° C. for 5 minutes to form a resist film of 0.6 μm in thickness. Then, the resist film was irradiated via a mask pattern with 500 mJ/cm$^2$ ultraviolet ray at a wavelength of 254 nm from a low-pressure mercury lamp. The resist film after irradiation was developed in a 2.38 wt % aq. tetramethyl ammonium hydroxide solution at 25° C. for 60 seconds to form a resist pattern. The resolution of the resist pattern thus obtained was poor and its sectional shape was trapezoid.

(COMPARATIVE EXAMPLE I-2)

100 parts by weight of the same polysilane as in Example (I-1) and 10 parts by weight of t-butylperoxybenzoate were dissolved in toluene to obtain a toluene solution (photosensitive composition). This toluene solution (photosensitive composition) was spin coated onto a silicon substrate and pre-baked at 100° C. for 5 minutes to form a resist film of 0.6 μm in thickness. Then, the resist film was irradiated via a mask pattern with 500 mJ/cm$^2$ ultraviolet ray at a wavelength of 254 nm from a low-pressure mercury lamp. The resist film after irradiation was developed in a 2.38 wt % aq. tetramethyl ammonium hydroxide solution at 25° C. for 60 seconds to form a resist pattern. The resolution of the resist pattern thus obtained was poor and its sectional shape was trapezoid.

(EXAMPLE I-9)

100 parts by weight of the same polyphenylsilane as (AA-1) above except for its average molecular weight of 5,000, 10 parts by weight of 3,3',4,4'-tetra(t-butylperoxycarbonyl)benzophenone (BTTB), 4 parts by weight of benzoylperoxide as a radical generating-agent acting as a cross-linking agent for this polysilane, and 6 parts by weight of phenylene dialdehyde i.e. an unsaturated compound were dissolved in toluene to obtain a toluene solution (photosensitive composition). The resulting photosensitive composition was spin coated onto a silicon substrate and pre-baked at 100° C. for 5 minutes to form a resist film of 0.6 μm in thickness. Then, the resist film was irradiated via a mask pattern with 100 mJ/cm$^2$ ultraviolet ray at a wavelength of 254 nm from a low-pressure mercury lamp. The resist film after irradiation was developed in a 2.38 wt % aq. tetramethyl ammonium hydroxide solution at 25° C. for 60 seconds to form a resist pattern, and the resulting pattern was rinsed with purified water. As a result, a positive pattern excellent in its pattern shape could be formed with high accuracy.

Further, this pattern was gradually heated and step-baked at 100 to 200° C. for about 30 minutes. Even after this thermal treatment, the pattern shape was not impaired, and it was confirmed that the surface hardness of the pattern after the thermal treatment has sufficient hardness as high as 3 H in terms of pencil hardness.

(EXAMPLE I-10)

10 parts by weight of the same polysilane as in Example (I-9), 1 part by weight of 3,3',4,4'-tetra(t-butylperoxycarbonyl)benzophenone (BTTB), 10 parts by weight of polyvinylphenol with an average molecular weight of 12,000 i.e. an alkali-soluble organic compound were dissolved in toluene to prepare a toluene solution (photosensitive composition). The resulting toluene solution (photosensitive composition) was spin coated onto a silicon substrate and pre-baked at 100° C. for 5 minutes to form a resist film of 0.6 μm in thickness. Then, the resist film was irradiated via a mask pattern with 100 mJ/cm$^2$ ultraviolet ray at a wavelength of 254 nm from a low-pressure mercury lamp. The resist film after irradiation was developed in a 1.19 wt % aq. tetramethyl ammonium hydroxide solution at 25° C. for 60 seconds to form a resist pattern, and the resulting resist pattern was rinsed with purified water. As a result, a positive pattern excellent in its pattern shape could be formed with good accuracy.

(COMPARATIVE EXAMPLE I-3)

10 parts by weight of polysilane with the same structure as (AA-1) above except for its average molecular weight of 5,000 and 10 parts by weight of polyvinylphenyl with an average molecular weight of 12,000 i.e. an alkali-soluble organic compound were dissolved in toluene to prepare a toluene solution (photosensitive composition). The resulting photo-sensitive composition was spin coated onto a silicon substrate and pre-baked at 100° C. for 5 minutes to form a resist film of 0.6 μm in thickness. Then, the resist film was irradiated via a mask pattern with 100 mJ/cm$^2$ ultraviolet ray at a wavelength of 254 nm from a low-pressure mercury lamp. The resist film after irradiation was attempted to be developed in a 1.19% aq. tetramethyl ammonium hydroxide solution at 25° C. for 60 seconds, but no pattern was formed.

(EXAMPLE I-11)

5 parts by weight of polyphenylsilane with the same structure as (AA-1) above except for its average molecular weight of 7,000, 1 part by weight of 3,3',4,4'-tetra(t-butylperoxycarbonyl)benzophenone (BTTB), and 10 parts by weight of a polyamic acid i.e. an alkali-soluble organic compound (intrinsic viscosity of 0.5 g/dl N-methyl-2-pyrrolidone solution as determined at 30° C.: 0.54 dl/g were dissolved in y-butyrolactone to prepare a resist solution. The resulting resist solution was spin coated onto a silicon substrate and pre-baked at 100° C. for 5 minutes to form a resist film of 1.2 µm in thickness. Then, the resist film was irradiated via a mask pattern with 100 mJ/cm$^2$ ultraviolet ray at a wavelength of 254 nm from a low-pressure mercury lamp. The resist film after irradiation was developed in a 0.56 wt % aq. tetramethyl ammonium hydroxide solution at 25° C. for 10 seconds. As a result, a positive pattern excellent in its pattern shape could be formed with good accuracy.

This pattern was further subjected to thermal treatment at 150° C. for 1 hour, 250° C. for 1 hour and 400° C. for 1 hour so that the polyamic acid in the pattern could be sufficiently imidated to give a film pattern based on polyimide.

(EXAMPLE I-12)

10 parts by weight of polyphenylsilane with the same structure as (AA-1) above except for its average molecular weight of 12,000 and 1 part by weight of 3,3',4,4'-tetra(t-butylperoxycarbonyl)benzophenone (BTTB) were dissolved in toluene to prepare a toluene solution (photosensitive composition). The resulting toluene solution (photosensitive composition) was spin coated onto a silicon substrate and pre-baked at 100° C. for 5 minutes to form a resist film of 0.7 µm in thickness. Then, the resist film was irradiated via a mask pattern with 100 mJ/cm$^2$ ultraviolet ray at a wavelength of 254 nm from a low-pressure mercury lamp. The resist film after irradiation was developed in a 2.38 wt % aq. tetramethyl ammonium hydroxide solution at 25° C. for 60 seconds. As a result, a pattern of 1.0 µm in line width was formed.

This pattern was further heated gradually from room temperature to 400° C. to obtain an insulating film with a dielectric constant of 2.8% and a volume resistivity of $1 \times 10^{13}$ Ω·cm.

(EXAMPLE I-13)

In the above description, a positive pattern was formed by developing a light-exposed resist film in an alkali developing liquid. However, a negative pattern can also be formed using the photosensitive composition of the present invention.

Hereinafter, the process for forming a negative pattern using the photosensitive composition of the present invention is described by reference to the drawings. FIGS. 3A to 3D are sectional drawings showing the steps of forming a negative pattern.

Figure 3A:
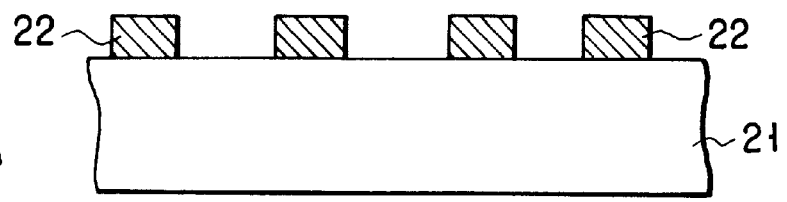
FIGS. 3A to 3D are sectional views showing an example of the steps for carrying out the process for forming an insulating film pattern by use of the photosensitive composition of the present invention.
Figure 3B:
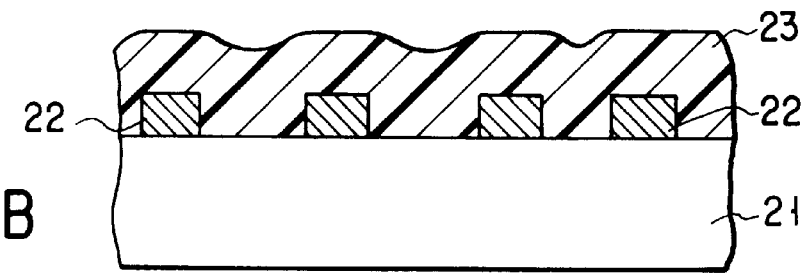

As shown in FIG. 3A, wirings 22 with predetermined width and thickness are formed at predetermined intervals on the substrate 21. Subsequently, a solution of the photosensitive composition of the present invention is applied onto a substrate and dried in the same manner as for the positive pattern, whereby the resist film 23 as shown in FIG. 3B is obtained.

Figure 3C:
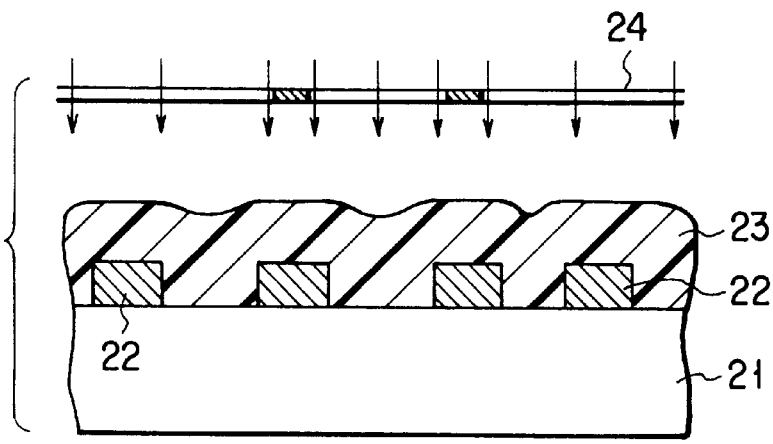
Figure 3D:
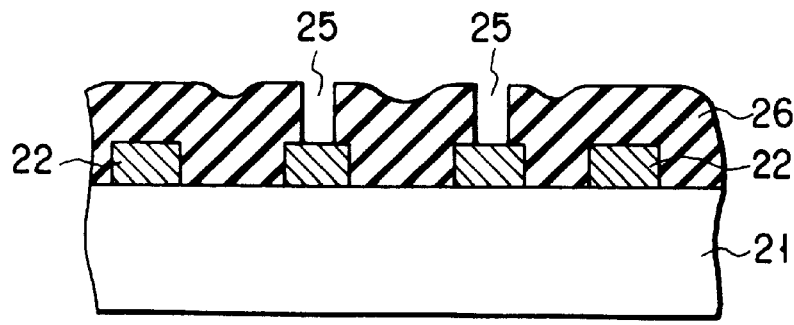

Then, the resulting resist film 23 is selectively irradiated via mask 24 with ultraviolet ray from a low-pressure mercury lamp as a light source, as shown in FIG. 3C. The conditions for pattern irradiation may be the same as for a positive pattern. Subsequently, it is subjected to thermal treatment at 150 to 200° C. for 1 to 10 minutes and developed for 30 to 120 seconds in an organic solvent such as toluene, xylene etc. By these steps, the unexposed portion of the resist film is selectively dissolved and removed as shown in FIG. 3D. As a result, a through hole 25 is opened to obtain negative resist pattern 26.

The shape of the resulting pattern is excellent in the case of such a negative pattern, but the positive pattern is advantageous in that an aq. alkaline solution with less influence on the environment can be used.

In this example, a negative pattern was formed in the following manner. In the step described in Example (I-12) above, the film after pattern irradiation was heated at 150° C. for 3 minutes. The resist film thus heated was developed in toluene for 90 seconds so that a reverse pattern of 1.0 µm in line width was formed similarly as described above.

This pattern was heated gradually from room temperature to 400° C. whereby an insulating film with a dielectric constant of 2.8% and a volume resistivity of $1 \times 10^{13}$ Ω·cm was obtained.

(EXAMPLES I-14 to I-21)

The same photosensitive compositions as in Examples (I-1) to (I-8) were applied to a 2-layered resist and a pattern was transferred to its underlying layer in the following manner. OFBR 800 (Tokyo Ohka Co., Ltd., Japan) was applied onto a substrate and pre-baked at 250° C. for 10 minutes to form a carbon type film of 1.0 µm in thickness. A film containing the photosensitive composition of the present invention was further formed under the same conditions as above and subjected to patterning under the same conditions to form a photosensitive composition film pattern.

The resulting pattern was used as an etching mask, and 1000 WRF plasma discharge was applied for etching a carbon type film in the presence of oxygen at 2.2 Torr. As a result, a pattern of 0.15 to 0.25 µm in line width was transferred to the carbon film.

It is understood that by use of the pattern obtained using the photosensitive composition of the present invention, the pattern of the photosensitive composition film could be transferred with good reproducibility to the carbon type film as underlying layer.

(EXAMPLES I-22 to 29)

A pattern was formed on a silicon wafer substrate by using the same photosensitive compositions under the same conditions as in Examples (I-1) to (I-8) above. The resulting pattern film was baked at 300° C. for 5 minutes and used as an etching mask to etch a silicon wafer under application of 20 v bias at 35 SCCM and 25 mTorr. As a result, a pattern of 0.15 to 0.25 µm was transferred to the silicon wafer.

It is understood that by use of the pattern obtained using the photosensitive composition of the present invention, the pattern of the photosensitive composition film could be transferred with good reproducibility to the silicon wafer.

(EXAMPLE II)

In this example, a photosensitive composition prepared by mixing a benzophenone type compound having an organic peroxide with polysilane having a repeating unit represented by the above general formula (5) was used to form a pattern.

First, the polysilane used in this example was synthesized in the following manner.

(Synthesis of Polysilane AA-11)

16.6 g of methylphenyldichlorosilane was dissolved in toluene to prepare a 50 wt % toluene solution. Separately, 8.4 g of finely divided metal Na was dispersed in 100 ml toluene in a 1-L flask and the above 50 wt % toluene solution was added dropwise to this dispersion to obtain a mixture. This mixture was stirred for 2 hours, then cooled to room temperature, and filtered in an argon atmosphere. The resulting filtrate was concentrated and added dropwise to methanol to precipitate the polymer. Then, the resulting polymer was dried under reduced pressure, dissolved again in toluene, and washed with water. Further, the polymer after washed with water was added dropwise to methanol to give the polymer.

These procedures were repeated 5 times to obtain the polymer, and this product was dried under reduced pressure to obtain organic polysilane (AA-11) with a weight average molecular weight of about 15,000 represented by the following formula:

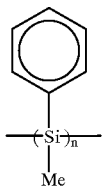

(AA-11)

where n represents degree of polymerization.

(Synthesis of Polysilane AA-12)

10 g of dimethyldichlorosilane and 16.6 g of methylcyclohexyldichlorosilane were dissolved in toluene to prepare a 50 wt % toluene solution. Separately, 8.4 g of finely divided metal Na was dispersed in 100 ml toluene in a 1-L flask and the above 50 wt % toluene solution was added dropwise to this dispersion to obtain a mixture. This mixture was refluxed for 2 hours, then cooled to room temperature, and filtered in an argon atmosphere. The resulting filtrate was concentrated and added dropwise to methanol to precipitate the polymer. Then, the resulting polymer was dried under reduced pressure, dissolved again in toluene, and washed with water. Further, the polymer after washed with water was added dropwise to methanol to give the polymer.

These procedures were repeated 5 times to obtain the polymer, and this product was dried under reduced pressure to obtain organic polysilane (AA-12) with a weight average molecular weight of about 22,000 represented by the following formula:

(AA-12)

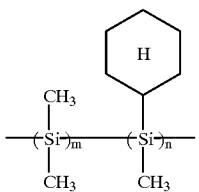

where m and n each represent degree of polymerization.

(Synthesis of Polysilane AA-13)

0.25 mole of 2-(4-dicyclohexenylethyl)methyldichlorosilane and 0.25 mole of methylpropyldichlorosilane were dissolved in 500 ml toluene to prepare a toluene solution. Separately, 8.4 g of finely divided metal Na was dispersed in 100 ml toluene in a 1-L flask and the above toluene solution was added dropwise to this dispersion to obtain a mixture. This mixture was refluxed for 2 hours, then cooled to room temperature, and filtered in an argon atmosphere. The resulting filtrate was concentrated and added dropwise to methanol to precipitate the polymer (polysilane), and the resulting polymer was dissolved in tetrahydrofuran. Then, 200 ml of a tetrahydrofuran solution of diborane was added dropwise to it. Further, 30 ml of 3 N aq. NaOH and 30% aq. $H_2O_2$ were added dropwise to it in this order to convert vinyl groups of side chains in the polysilane to hydroxy groups. The above step gave organic polysilane (AA-13) with a weight average molecular weight of about 100,000 represented by the following formula:

(AA-13)

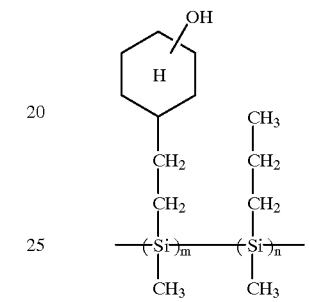

where m and n each represent degree of polymerization.

(EXAMPLE II-1)

100 parts by weight of polysilane with an average molecular weight of 15,000 represented by the above formula (AA-11) and 10 parts by weight of 3,3',4,4'-tetra(t-butylperoxycarbonyl)benzophenone (BTTB) were dissolved in toluene to obtain a resist solution. This resist solution was spin coated onto a substrate and dried to form a resist film of 0.5 μm in thickness. Then, the resist film was irradiated via a mask pattern with 400 mJ/cm² ultraviolet ray at a wavelength of 254 nm from a low-pressure mercury lamp. The resist film after irradiation was immersed in a 2.38 wt % aq. tetramethyl ammonium hydroxide solution and developed at 25° C. for 60 seconds. As a result, a pattern excellent in its pattern shape was formed with good accuracy.

(COMPARATIVE EXAMPLE II-1)

100 parts by weight of polysilane with the same structure as in Example (II-1) was dissolved in toluene to obtain a resist solution. Its resist film was spin coated onto a silicon substrate and dried to form a resist film of 0.5 μm in thickness. Then, the resist film was irradiated via a mask pattern with 400 mJ/cm² ultraviolet ray at a wavelength of 254 nm from a low-pressure mercury lamp. The resist film after irradiation was attempted to be developed by immersing it in an aq. 2.38 wt % tetramethyl ammonium hydroxide solution. However, no pattern was formed.

(COMPARATIVE EXAMPLE II-2)

Pattern formation was attempted using the same polysilane as in Comparative Example (II-1) in the same manner as in Comparative Example (II-1) except that the exposure amount was 2000 mJ/cm². As a result, a pattern was formed, but its sectional shape was trapezoid and resist pattern with a rectangular section could not be formed.

(EXAMPLE II-2)

100 parts by weight of polysilane represented by the above formula (AA-12) and 10 parts by weight of 3,3',4,4'- tetra(t-butylperoxycarbonyl)benzophenone (BTTB) were dissolved in toluene to obtain a resist solution. This resist solution was spin coated onto a substrate and dried to form a resist film of 0.5 μm in thickness. Then, the resist film was irradiated via a mask pattern with 400 mJ/cm² ultraviolet ray at a wavelength of 254 nm from a low-pressure mercury lamp. The resist film after irradiation was immersed in an aq. 2.48 wt % tetramethyl ammonium hydroxide solution and developed at 25° C. for 60 seconds. As a result, a positive pattern excellent in its pattern shape could be formed with good accuracy.

(EXAMPLE II-3)

5 parts by weight of polysilane with the same structure as in Example (II-1), 0.5 part by weight of 3,3',4,4'-tetra(t-butylperoxycarbonyl)benzophenone (BTTB), and polyvinylphenol with an average molecular weight of 12,000 i.e. an alkali-soluble organic compound were dissolved in toluene to prepare a resist solution. This resist solution was spin coated onto a silicon substrate and dried to form a resist film of 0.6 μm in thickness. Then, the resist film was irradiated via a mask pattern with 400 mJ/cm² ultraviolet ray at a wavelength of 254 nm from a low-pressure mercury lamp. The resist film after irradiation was immersed in an aq. 1.19 wt % tetramethyl ammonium hydroxide solution and developed at 25° C. for 60 seconds. As a result, a positive pattern excellent in its pattern shape could be formed with high accuracy.

(COMPARATIVE EXAMPLE II-3)

5g of polysilane with the same structure as in Example (II-1) and 10g of polyvinylphenol with an average molecular weight of 12,000 i.e. an alkali-soluble organic compound were dissolved in 100 g of t-butyl lactate to obtain a resist solution. This resist solution was spin coated onto a silicon substrate and pre-baked at 100° C. for 5 minutes to form a resist film of 0.6 μm in thickness. Then, the resist film was irradiated via a mask pattern with 400 mJ/cm² ultraviolet ray at a wavelength of 254 nm from a low-pressure mercury lamp. The resist film after irradiation was attempted to be developed by immersing it in an aq. 1.19 wt % tetramethyl ammonium hydroxide solution at 25° C. for 60 seconds. However, no pattern was formed.

(COMPARATIVE EXAMPLE II-4)

5 g of polysilane represented by the above formula (AA-13), 0.5 g of 3,3',4,4'-tetra(t-butylperoxycarbonyl)benzophenone (BTTB), and log of polyamic acid (intrinsic viscosity of 0.5g/dl N-methyl-2-pyrorridone solution as determined at 30° C.: 0.54 dl/g) were dissolved in 100 g of γ-butyrolactone to obtain a resist solution. The resulting resist solution was spin coated onto a silicon substrate and pre-baked at 100° C. for 5 minutes to form a resist film of 1.2 μm in thickness. Then, the resist film was irradiated via a mask pattern with ultraviolet ray at a wavelength of 254 nm from a low-pressure mercury lamp. The resist film after irradiation was immersed in an aq. 0.56 wt % tetramethyl ammonium hydroxide solution and developed at 250° C. for 10 seconds. As a result, a positive pattern excellent in its pattern shape was formed with high accuracy.

Further, this resist pattern was subjected to thermal treatment at 150° C. for 1 hour, 250° C. for 1 hour, and 400° C. for 1 hour. After thermal treatment, the polyamic acid in the pattern was sufficiently imidated so that a film pattern based on polyimide resin could be obtained.

(EXAMPLE II-5)

5 g of polysilane with a molecular weight of 12,000 having the structural unit represented by the above formula (AA-11) and 0.5 g 3,3',4,4'-tetra(t-butylperoxycarbonyl) benzophenone (BTTB) were dissolved in 100 g of toluene to obtain a 10% resist solution. The resist solution thus obtained was spin coated onto a substrate and then pre-baked at 100° C. for 5 minutes to form a resist film of 0.7 μm in thickness.

Then, the resist film was irradiated via a mask pattern with 400 mJ/cm² ultraviolet ray at a wavelength of 254 nm from a low-pressure mercury lamp. The resist film after irradiation was immersed in a 2.38 wt % aq. tetramethyl ammonium hydroxide solution and developed at 25° C. for 90 seconds. As a result, a pattern of 0.5 μm in line width was formed.

This pattern was heated gradually from room temperature to 400° C. to obtain an insulating film with a dielectric constant of 2.8% and a volume resistivity of $1 \times 10^{13}$ Ω·cm.

In the above step, the resist film after pattern irradiation was heated at 150° C. and developed in toluene for 90 seconds so that a reverse pattern of 1.0 μm in line width was formed similarly as described above.

This pattern was heated gradually from room temperature to 400° C. whereby an insulating film with a dielectric constant of 2.8% and a volume resistivity of $1 \times 10^{13}$ Ω·cm was obtained.

(EXAMPLE II-6)

The same photosensitive composition as in Example (II-1) was applied to a 2-layred resist and a pattern was transferred to its underlying layer as follows: OFBR 800 (Tokyo Ohka Co., Ltd., Japan) was applied onto a substrate and baked at 250° C. for 10 minutes, thus forming a carbon type film of 1.0 μm in wall thickness. By patterning under the same conditions as described above, a photosensitive composition film pattern was formed.

The resulting pattern was used as an etching mask and a carbon type film was etched using 1000 WRF plasma discharge in oxygen at 2.2 Torr. As a result, a pattern of 0.25 μm in line width was transferred to the carbon type layer.

As is evident from the above results, the pattern formed using the process for forming a pattern according to the present invention can be used to transfer the photosensitive composition pattern to a carbon type layer with good reproducibility.

(EXAMPLE II-7)

A pattern was formed on a silicon wafer substrate by using the same photosensitive compositions under the same conditions as in Example (II-1) above. The resulting pattern film was baked at 300° C. for 5 minutes and used as an etching mask to etch a silicon wafer by application of 20 V bias at 35 SCCM, 25 mTorr. As a result, a pattern of 0.15 to 0.25 μm in line width was transferred to the silicon wafer.

It is understood that the pattern formed using the process for forming a pattern according to the present invention can be used to transfer the photosensitive composition film pattern to a silicon wafer with good reproducibility.

(EXAMPLE II-8)

An example where the photosensitive composition of the present invention is applied to formation of 2-layred wiring is described by reference to FIGS. 4A to 4D.

FIG. 4A is a sectional view showing a structure in which resist film 37 containing the photosensitive composition of the present invention is formed on the outermost surface of the substrate 31 on which a wiring layer and an insulating layer have been formed. In the semiconductor substrate 31, elements such as MOSFET, diode etc. (not shown) are formed. This structure was formed as follows: First, silicon oxide film 32 of about 0.8 μm in thickness was formed on the semiconductor substrate 31 by the CVD method, and lower-layer wiring 34 of about 0.7 μm in thickness consisting of Al—Si—Cu and an interlayer insulating film 33 containing of SiO$_2$ were formed subsequently on the silicon oxide film 32 by sputtering. The lower-layer wiring 34 and interlayer insulating film 23 were provided thereon with upper-layer wiring layer 35 of about 0.7 μm in thickness comprising Al—Si—Cu. An about 0.7 μm step occurred on the upper-layer wiring film.

Then, a photoresist was applied onto the upper-layer wiring layer 35 and the resulting coated film was heated at 200° C. for 30 minutes in a N$_2$ atmosphere to form sublayer resist film 36 of about 1.5 μm in thickness.

The same photosensitive composition as in Example (II-1) was further applied onto the sublayer resist film 36 to form photosensitive composition film 37 of about 0.2 μm in thickness, whereby the structure shown in FIG. 4A was obtained.

This photosensitive composition film 37 was subjected to patterning in the same manner as in Example (II-1) whereby the patterned photosensitive composition film 37A as shown in FIG. 4B was formed.

The resulting photosensitive composition film pattern 37A was used as an etching mask to selectively etch the sublayer resist film 36 by the RIE method using O$_2$ gas. Further, the photosensitive composition film pattern 37A and patterned sublayer resist film 36A were used as etching masks to selectively etch and remove the exposed region of the upper-layer wiring layer 35 by the RIE method using chlorine type gas such as CCl$_4$ etc. to form the upper-layer wiring 35A shown in FIG. 4C.

In the subsequent steps, the photosensitive composition film pattern 37A was removed by the RIE method using CF$_4$ gas, and the sublayer resist film 36 was carbonized in O$_2$ plasma to obtain the 2-layered wiring shown in FIG. 4D.

(EXAMPLE II-9)

An example where the process for forming a pattern according to the present invention is applied to formation of metallic wiring is described by reference to FIGS. 5A to 5D.

FIG. 5A is a sectional view showing a structure in which a resist film containing the photosensitive composition of the present invention is formed on the outermost surface of substrate 41 on which a metallic film and a sublayer resist layer have been laminated. In the semiconductor substrate 41, elements such as MOSFET, diode etc. (not shown) are formed. This structure was formed as follows: First, silicon oxide film 42 of about 0.8 μm in thickness was formed on the semiconductor substrate 41 by the CVD method. Then, titanium-containing tungsten (Ti—W) film 43 and gold (Au) film 44 of about 0.1 μm in thickness were formed subsequently by sputtering.

Then, a photoresist was applied onto the Au film 44 and heated at 130° C. for 60 minutes in a N$_2$ atmosphere to form a sublayer resist film 45 of 1.5 μm in thickness.

The same photosensitive composition as in Example (II-1) was further applied onto the sublayer resist film 45 to form photosensitive composition film 46 of about 0.3 μm in thickness, whereby the structure shown in FIG. 5A was obtained.

This photosensitive composition film 46 was subjected to patterning in the same manner as in Example (II-1) to obtain patterned photosensitive composition film 46A. This photosensitive composition film pattern 46A was used as an etching mask to selectively etch and remove the sublayer resist layer 45 by the RIE method using O$_2$ gas under a pressure of about 5 Pa to form groove 48. Ti—W film 43 and Au film 44 exposed at the bottom of the resulting groove 48 were used as electrodes so that Au-plated film 49 of about 1 μm in thickness was formed in the groove by electrolytic plating. By the steps as described above, the structure shown in FIG. 5B was obtained.

Further, the photosensitive composition film pattern 46A was removed by 10% hydrofluoric acid solution, and the sublayer resist film 45A was removed by carbonizing it in O$_2$ plasma. By these treatments, Au-plated film 49 was protruded over the Au film 44 as shown in FIG. 5C.

Then, the exposed Au film 44 was removed by ion milling, and the exposed Ti—W film 43 was removed by means of fluorine type gas. By the steps described above, Au wiring 50 as shown in FIG. 5D was formed.

According to the present invention as described in detail, there is provided a process for forming a pattern in which a fine resist pattern excellent in sectional shape and resolution can be formed with high sensitivity to light exposure. According to the present invention, there is further provided a process for forming a pattern in which a pattern can be formed accurately by alkali development.

If a resist pattern formed in said method is used as an etching mask in the process for producing an electronic device according to the present invention, an ultra-fine pattern can be accurately transferred to substrate etc. Furthermore, the resist pattern formed using the present invention is excellent as an insulating film because of superior characteristics such as high resistance and high strength, and thus it can be effectively utilized as a passivation film and an interlayer insulating film in semiconductor devices, and therefore is very variable in industrial view point.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A photosensitive composition comprising a polysilane having a repeating unit represented by the following general formula (1) and a benzophenone compound having an organic peroxide;

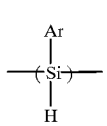

(1)

wherein Ar represents a substituted or unsubstituted aryl group, wherein a light-exposed portion of said composition becomes soluble in an alkaline solution by decomposition of said polysilane.

2. The photosensitive composition according to claim 1, which further comprises an alkali-soluble organic compound.

3. The photosensitive composition according to claim 1, which further comprises a cross-linking agent for polysilane.

4. The photosensitive composition according to claim 1, wherein said benzophenone compound having an organic peroxide is at least one selected from compounds represented by the following general formula (2) to (4):

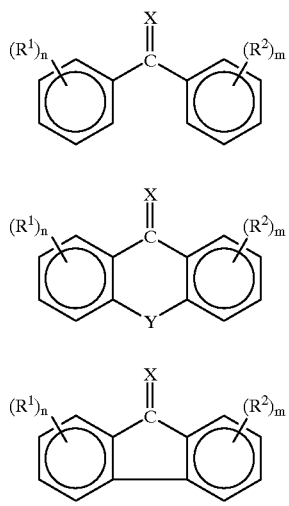

where $R^1$ and $R^2$ may be the same or different and represent a group having an organic peroxide; X is an oxygen atom or sulfur atom; Y is an oxygen atom, sulfur atom, —$CH_2$— or —$N(R^3)$— whereupon $R^3$ is an alkyl group; and m and n independently represent an integer of 0 to 5 whereupon m and n are not simultaneously 0.

5. The photosensitive composition according to claim 4, wherein said benzophenone compound having an organic peroxide is a compound represented by the above general formula (2) and both m and n are 2 in the above general formula (2).

6. The photosensitive composition according to claim 4, which further comprises an alkali-soluble organic compound.

7. The photosensitive composition according to claim 1, wherein said polysilane generates a Si—OH bond and said benzophenone compound having an organic peroxide decomposes to generate a photodecomposed product having solubility in a aqueous alkali solution upon exposer to light, thereby said composition becomes soluble in an alkaline solution upon exposure to light.

* * * * *